(12) United States Patent
Zundel et al.

(10) Patent No.: US 9,054,150 B2
(45) Date of Patent: Jun. 9, 2015

(54) CHIP EDGE SEALING

(71) Applicant: Infineon Technologies AG, Neubiberg (DE)

(72) Inventors: Markus Zundel, Egmating (DE); Gabriela Brase, Unterhaching (DE); Peter Nelle, Munich (DE); Guenther Schindler, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/032,437

(22) Filed: Sep. 20, 2013

(65) Prior Publication Data

US 2014/0077262 A1   Mar. 20, 2014

(30) Foreign Application Priority Data

Sep. 20, 2012   (DE) .......................... 10 2012 018 611

(51) Int. Cl.
| | |
|---|---|
| *H01L 29/739* | (2006.01) |
| *H01L 29/78* | (2006.01) |
| *H01L 23/31* | (2006.01) |
| *H01L 29/40* | (2006.01) |
| *H01L 29/06* | (2006.01) |

(52) U.S. Cl.
CPC ........... *H01L 29/7393* (2013.01); *H01L 29/407* (2013.01); *H01L 29/7811* (2013.01); *H01L 29/7813* (2013.01); *H01L 29/0657* (2013.01); *H01L 23/3178* (2013.01); *H01L 23/3192* (2013.01); *H01L 2924/0002* (2013.01)

(58) Field of Classification Search
CPC . H01L 29/7391; H01L 29/06; H01L 23/3178; H01L 23/3192; H01L 28/7813; H01L 19/7811; H01L 29/78; H01L 21/76; H01L 29/407; H01L 29/0657
See application file for complete search history.

(56) References Cited

U.S. PATENT DOCUMENTS

| | | | |
|---|---|---|---|
| 4,137,109 A * | 1/1979 | Aiken et al. | 438/325 |
| 5,206,182 A * | 4/1993 | Freeman | 438/203 |
| 5,945,692 A | 8/1999 | Yano et al. | |
| 7,999,343 B2 * | 8/2011 | Tihanyi et al. | 257/452 |

FOREIGN PATENT DOCUMENTS

DE   69507987 T2   7/1999

* cited by examiner

*Primary Examiner* — William D Coleman
(74) *Attorney, Agent, or Firm* — Shumaker & Sieffert, P.A.

(57) ABSTRACT

The invention relates to a semiconductor component comprising a semiconductor body, an insulation on the semiconductor body and a cell array arranged at least partly within the semiconductor body. The cell array has at least one p-n junction and at least one contact connection. The insulation is bounded in lateral direction of the semiconductor body by a circumferential diffusion barrier.

19 Claims, 8 Drawing Sheets

CHIP EDGE SEALING

The present description relates to semiconductor components. The present description relates more particularly to field-effect-controlled semiconductor components and to diffusion of mobile ions into electrical insulations of the field-effect-controlled semiconductor components.

INTRODUCTION

Field-effect transistors (FETs) and other field-effect-controlled semiconductor components (IGBTs, gate-controlled diodes) have, between the gate electrode and the body region in which an electrically conductive channel is formed, an insulation which electrically separates the gate electrode from the body region. This insulation in many cases is composed of silicon dioxide and is usually referred to as gate oxide (GOX).

As well as the gate oxide, one or more insulation layers may be applied on a semiconductor component for electrical insulation, in order to electrically insulate the semiconductor body from the environment. These insulation layers may likewise be composed of silicon dioxide and be of different quality. These insulation layers may comprise oxides such as field oxide layers (FOX) or buffer oxide layers (BOX), and be executed in various configurations integrated with, onto or into the gate oxide. In many cases, the different oxide layers adjoin one another.

The electrical insulation of the semiconductor depends on the quality of the oxides used and a relevant parameter for the function of the semiconductor component. Ions such as Li+, Na+, K+ and others can penetrate into the oxide and diffuse within the various oxide layers. These ions are therefore also referred to as mobile ions. As a result, the electrical insulation properties of field-effect-controlled semiconductor components are impaired and the electrical properties thereof are influenced; for example, the use voltage ($V_{th}$) is lowered.

Ions can penetrate into the oxide over the entire production operation, but also over the entire lifetime of the field-effect-controlled semiconductor component, and alter the electrical properties.

SUMMARY

The aim of the present description is to improve field-effect-controlled semiconductor components.

For this purpose, the present description proposes a semiconductor component according to the independent claims. The description relates to semiconductor components comprising a semiconductor body, an insulation on the semiconductor body and a cell array arranged at least partly within the semiconductor body. The cell array has at least one p-n junction and at least one contact connection.

The insulation is bounded in lateral direction of the semiconductor body by a circumferential diffusion barrier.

Alternatively or additionally, the diffusion barrier may be arranged in lateral direction of the semiconductor body between a gate section of the insulation and an edge region of the semiconductor component.

The diffusion barrier can prevent inward diffusion of mobile ions in lateral direction.

Further optional features are mentioned in the dependent claims, each of which can be combined with all the independent claims.

DETAILED DESCRIPTION

Figure 1:
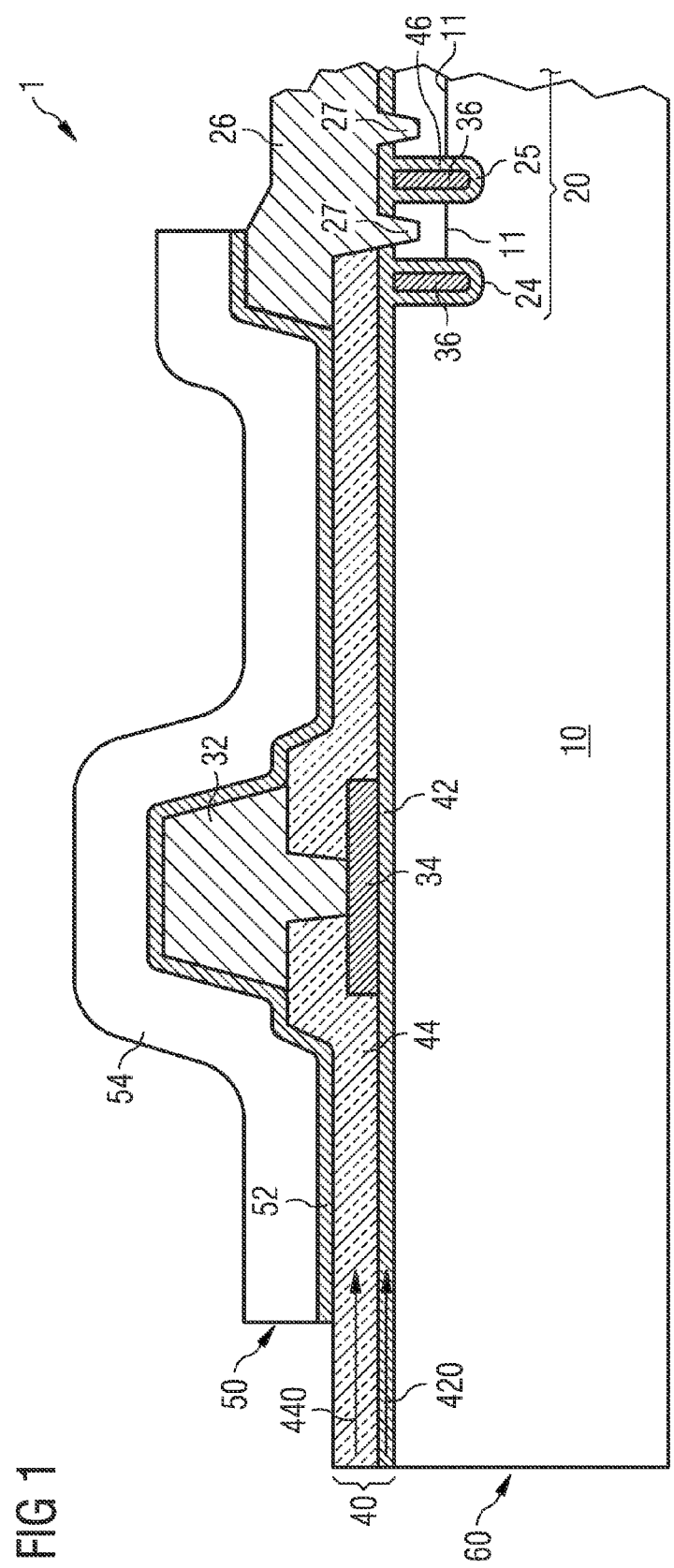
FIG. 1 shows, in schematic form, a cross-sectional view of a detail of an edge region of a semiconductor component.

Working examples of the invention are explained in detail hereinafter, with reference to the appended figures. However, the invention is not restricted to the embodiments described specifically, but can be modified and altered in a suitable manner. The scope of the invention includes suitable combination of individual features and feature combinations of one embodiment with features and feature combinations of another embodiment in order to arrive at further inventive embodiments.

Before the working examples of the present invention are elucidated in detail hereinafter with reference to the figures, it is pointed out that identical elements in the figures are provided with the same or similar reference numerals, and that any repetition of description of these elements is omitted. Moreover, the figures are not necessarily to scale. The emphasis is instead on the elucidation of the basic principle.

Attributes such as "vertically" and "laterally" are based herein on the designs of the semiconductor component as commonly used in the field of semiconductors. Semiconductor components usually have a front side and a reverse side parallel to the front side, which relate to the two sides of a wafer from which the semiconductor component is produced. The term "vertically" denotes a direction from the front side to the reverse side, and the term "laterally" denotes a direction parallel to the front and/or reverse side. Equally, the terms "top", "bottom" relate to the semiconductor itself and not to the alignment thereof. It will be appreciated that the semiconductor component can be rotated and can be positioned in any desired alignments.

FIG. 1 shows, in schematic view, an example of an edge region section of a semiconductor component 1 in a cross section. FIG. 1 shows, for illustration purposes, merely an edge region between a component edge 60 of the semiconductor component and a cell array 20, and not the entire semiconductor component. The semiconductor component 1 comprises a semiconductor body 10 which may be composed, for example, of silicon. Disposed on the semiconductor body 10 is a cell array 20 having one or more contacts and at least one p-n junction 11. The cell array 20 shown in FIG. 1 comprises, by way of example, a source pad or source connection 26 connected via one or more source electrodes 27 to regions of the semiconductor body 10. Field-effect-controlled semiconductor components additionally comprise one or more gate electrodes 36, arranged in trenches 24, 25 in the example shown. The gate electrodes 36 are electrically insulated from the semiconductor body 10 by a gate section of the insulation 40, for example a gate oxide (GOX) 46. The example shown here indicates a possible structure, but another structure may also be provided. The structure is matched to the desired function of the semiconductor component. For this purpose, various regions with different dopings and different conductivities may be provided within the semiconductor body 10 in order to achieve the desired structure.

It is also possible to provide trenches 24, 25 having, as well as the gate electrode 36, a field electrode, for example at source potential, in which case the two electrodes are electrically insulated from one another. It is also possible to provide trenches which have only field electrodes (not shown) and which are provided with gate electrodes 36 in addition to the trenches 24, 25. It is also possible to dispense with trenches and to provide the gate electrode on the front side of the semiconductor component 1, i.e., for example, in a planar version without trenches.

The cell array 20 shown merely indicates the possible functionalities, and it is possible to add a multitude of features. According to the desired function, the cell array can be adapted in order to design the semiconductor component 1 as a field-effect transistor, IGBT, diode or the like. It is also possible to implement and combine a plurality of these elements in one semiconductor component.

In the case of vertical components, at least one contact, usually the drain connection, is on the reverse side of the semiconductor body (not shown). The other connections, for example a source connection 26 and a gate connection (not shown), are present on the front side of the semiconductor body, which is shown as the upper side in the figures.

The gate connection may be electrically connected via a gate connector (gaterunner) 32. In the example shown, the gaterunner 32 is disposed within a region between the cell array 20 and the lateral edge 60 of the semiconductor component. Below the gaterunner in the example shown is a gate plate 34 which may be produced from polycrystalline silicon or another conductive material. The gate plate 34 is electrically insulated from the semiconductor body 10 by means of a field oxide 42 (FOX). In the example shown, the field oxide 42 may be produced from silicon dioxide and connected to the gate oxide 46. The field oxide 42 may take the form of a layer and may extend essentially over the entire front side of the semiconductor component 1, in which case, for example, cutouts may be provided in the field oxide 42 for through-contacting in the region of the source electrodes 27. Further cutouts may be provided.

In addition to the field oxide 42 and the gate oxide, further oxide regions or other insulation regions may be provided, for example a buffer oxide 44. The buffer oxide 44 may be applied as a relatively thick layer and have, for example, a greater thickness than the field oxide 42. The buffer oxide 44 may likewise take the form of a layer and may extend essentially over the entire front side of the semiconductor component 1, in which case, for example, cutouts may be provided in the buffer oxide 44 for through-contacting in the region of the source electrodes 27 and in the region of the gate contact connection. Further cutouts may be provided.

The buffer oxide 44 electrically insulates the semiconductor body 10 and any conductors, electrodes etc disposed thereon from the environment of the semiconductor component.

The gate oxide 46, the field oxide 42 and the buffer oxide 44 together form an example of an insulation 40. Additionally or alternatively to the field oxide 42 and the buffer oxide 44, and the gate oxide 46, the insulation 40 may comprise further oxide layers or oxide regions.

The thickness and quality of the buffer oxide 44, of the field oxide 42 and especially of the gate oxide 46 are responsible for the insulation properties of the insulation 40. The quality of oxides depends to a significant degree on the number of mobile ions which can diffuse within the oxide. Mobile ions typically include lithium ions (Li+), sodium ions (Na+), potassium ions (K+), and possibly also chlorine ions (Cl−) and, to a lesser degree, magnesium ions (Mg++) or calcium ions (Ca++).

The mobile ions can be incorporated into the semiconductor component on direct contact with the component or from the environment. The mobile ions are disadvantageous especially in insulations 40, since mobile ions here can impair the insulation properties. Mobile ions can penetrate into the insulation during the production operation and over the entire lifetime of the semiconductor component, and so the electrical properties of the semiconductor component can change over the lifetime.

For protection of the insulation 40 from mobile ions, it is possible to apply a seal or diffusion stop 50 to the insulation 40. The diffusion stop 50 may comprise a silicon nitride layer 52 which may be disposed at least on sections of the buffer oxide 44. The silicon nitride layer 52 may cover the entire front side of the semiconductor component 1, except for contact regions such as the source pad 26. Silicon nitride has been found to be a good diffusion stop or diffusion barrier, which can prevent penetration of mobile ions in the vertical direction. As well as silicon nitride, crystalline silicon, polycrystalline silicon, imides and various metals (e.g. AlSiCu) are effective barriers against the diffusion of mobile ions.

The diffusion stop 50 may, for example, also comprise an imide layer 54. The imide layer 54 may be applied to the silicon nitride layer 52.

If a wafer having a multitude of semiconductor components including an insulation 40 and a diffusion stop 50 in vertical direction atop the semiconductor body is individualized into individual semiconductor components, the individualization may give rise to regions at the kerfs, i.e. at the lateral edges 60 of the individual semiconductor components 1, where part of the insulation 40 is open to the environment. It has been found that mobile ions can penetrate at these points along lateral diffusion paths 420, 440 in lateral direction into the field oxide 42 and/or into the buffer oxide 44.

Figure 2:
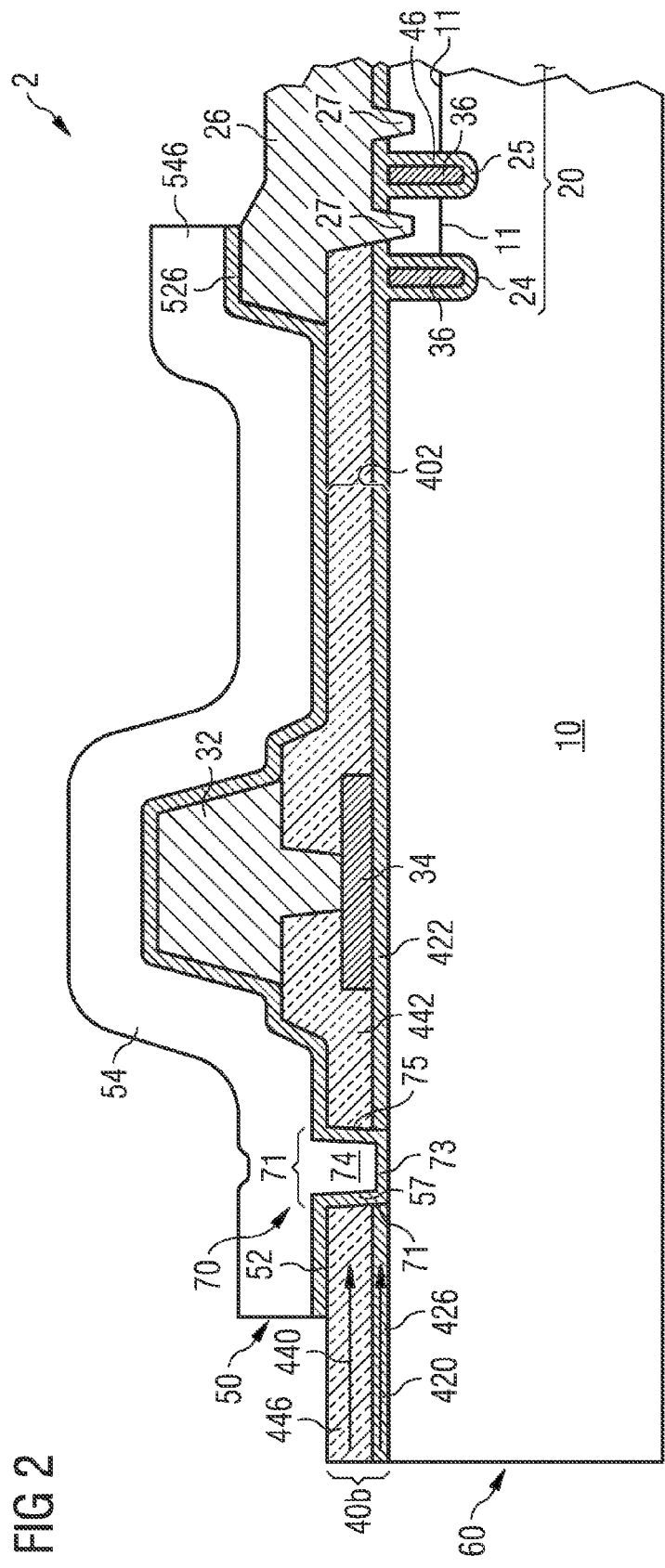
FIG. 2 shows the cross-sectional view of FIG. 1 with a first example of a lateral diffusion barrier.

FIG. 2 shows an example of a diffusion barrier 70 for prevention of diffusion in lateral direction (lateral diffusion barrier 70). The semiconductor component 11 of FIG. 2 corresponds substantially to the semiconductor component 1 of FIG. 1, with similar or identical features given the same reference numerals.

Compared to the semiconductor component 1 of FIG. 1, the semiconductor component 2 of FIG. 2 additionally has a lateral diffusion barrier 70. The lateral diffusion barrier 70 is disposed between the lateral edge 60 and the cell array 20 in the insulation 40 and separates the insulation into a cell insulation 402 and an edge insulation 406, and prevents lateral diffusion of mobile ions from the edge insulation 406 into the cell insulation 402. It is thus possible to prevent mobile ions which can penetrate into the insulation 40 at the lateral edge 60 from getting into the region of the cell array 20 or into the gate oxide 46. In the example shown, the diffusion barrier is disposed in lateral direction between the lateral edge 60 and the gaterunner 32 or the gate plate 34, such that this region too is protected from the inward diffusion of mobile ions.

The lateral diffusion barrier 70 may consist of a trench 71 in the insulation 40. In the example of FIG. 2, the trench 71 passes through the buffer oxide 44 and through the field oxide 42. The buffer oxide 44 and the field oxide 42 are each divided by the trench 71 into an outer edge region, a field oxide edge region 426 and a buffer oxide edge region 446, and an inner cell region, a field oxide cell region 422 and a buffer oxide cell region 442. The nitride 52, 57 is in direct contact with the silicon 10 beneath, and thus two sealing materials here cut off the diffusion of mobile ions. The field oxide edge region 426 and the buffer oxide edge region 446 thus have no oxidic connection with the field oxide cell region 422 and the buffer oxide cell region 442. This prevents diffusion of mobile ions, which takes place preferentially within oxides, from the lateral edge 60 to the cell array 20 in the insulation 40.

In the example of FIG. 2, a base 73 of the diffusion barrier trench 71 adjoins the semiconductor body 10. The base 73 and lateral walls 75 of the diffusion barrier trench 71 have a barrier silicon nitride layer 57, which may be bonded to the silicon nitride layer 52 of the vertical diffusion stop 50. In the example of FIG. 2, the barrier silicon nitride layer 57 in the region of the base 73 is in direct contact on the upper side of the semiconductor body 10, but does not extend into the semiconductor body 10.

The trench may also be filled with imide, referred to as trench imide 74. The trench imide 74 may be bonded to the imide 54 of the diffusion stop and may be executed together therewith.

Figure 3:
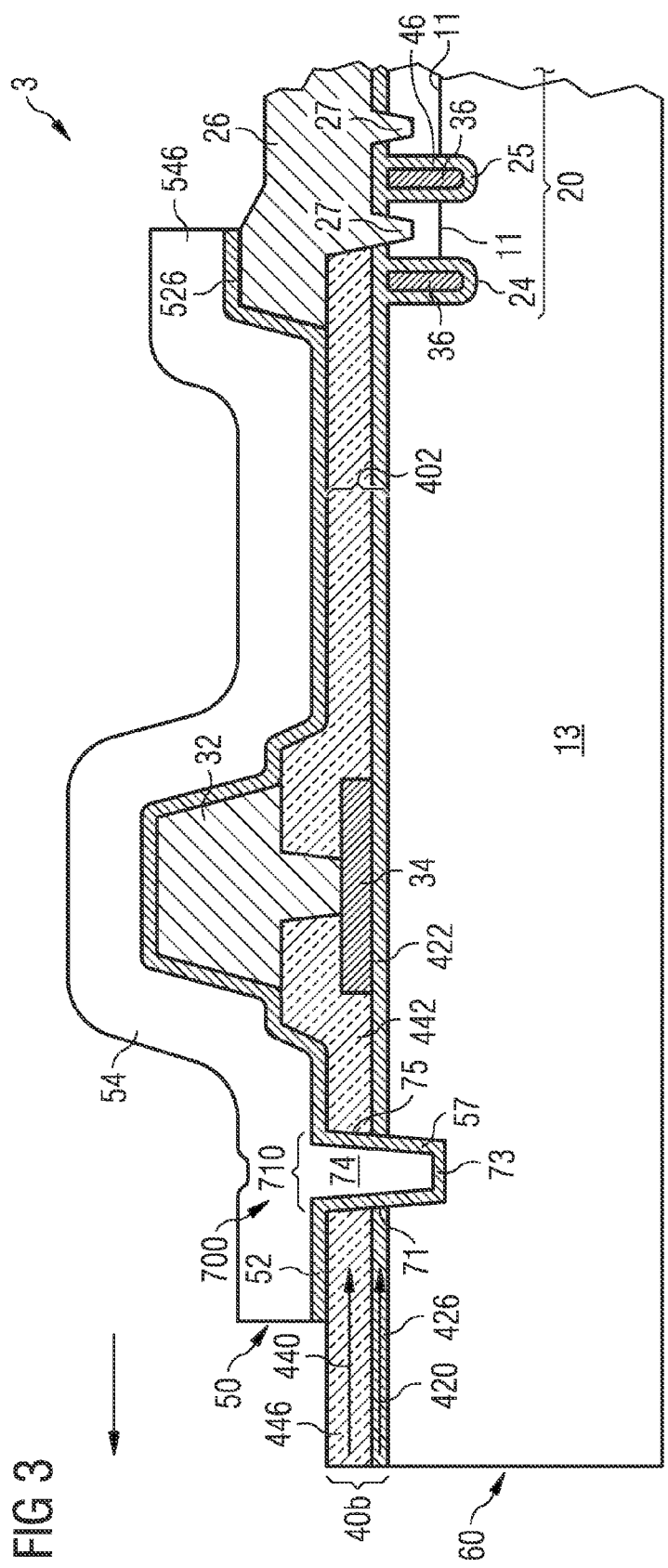
FIG. 3 shows the cross-sectional view of FIGS. 1 and 2 with a second example of a lateral diffusion barrier.

FIG. 3 shows a further example of a diffusion barrier 700 for prevention of diffusion in lateral direction (lateral diffusion barrier 700). The semiconductor component 3 of FIG. 3 corresponds substantially to the semiconductor component 2 of FIG. 2, with similar or identical features given the same reference numerals. Compared to the semiconductor component 3 of FIG. 2, the semiconductor component 3 of FIG. 3 has a deeper lateral diffusion barrier 700 in the form of a deeper trench 710, which projects into the semiconductor body 13. The base 730 of the deep trench 710 is thus below the front side of the semiconductor body 13. The deeper execution of the trench 710 and the overlapping of the trench with the silicon of the semiconductor body 13 allows better separation of the field oxide 42 into the field oxide edge region 426 and field oxide cell region 422. Lateral diffusion of mobile ions can thus be prevented even better.

In the semiconductor components 2, 3 of FIGS. 2 and 3, the cell insulation 402, and more particularly the buffer oxide cell region 442, the field oxide cell region 422 and the gate oxide 46, have uninterrupted sealing, i.e. are surrounded continuously by a diffusion-stopping or -inhibiting material, such that no mobile ions can penetrate in. As well as coverage with silicon nitride 52, 57, the cell insulation 402 is surrounded by the metal of the source pad 26, and by the semiconductor body 10, 13, all of which constitute diffusion barriers or a diffusion stop. This gives rise to uninterrupted, continuous sealing of the cell insulation 402 from the edge region as far as the chip interior or the cell array 20, such that no mobile ions can penetrate in.

In addition, the various elements of the sealing or of the diffusion stop may overlap in order to achieve reliable sealing from mobile ions. Thus, as shown in FIGS. 1 to 3, the silicon nitride 52 and the imide 54 each have an overlap 526, 546 at the source connection 26, where the silicon nitride 52 and the imide 54 are drawn a little further over the metal 26. This overlap can be supplemented by the deep trench 710, as shown in FIG. 3, such that the cell insulation 402 has optimal sealing at every point in the semiconductor component.

Figure 4:
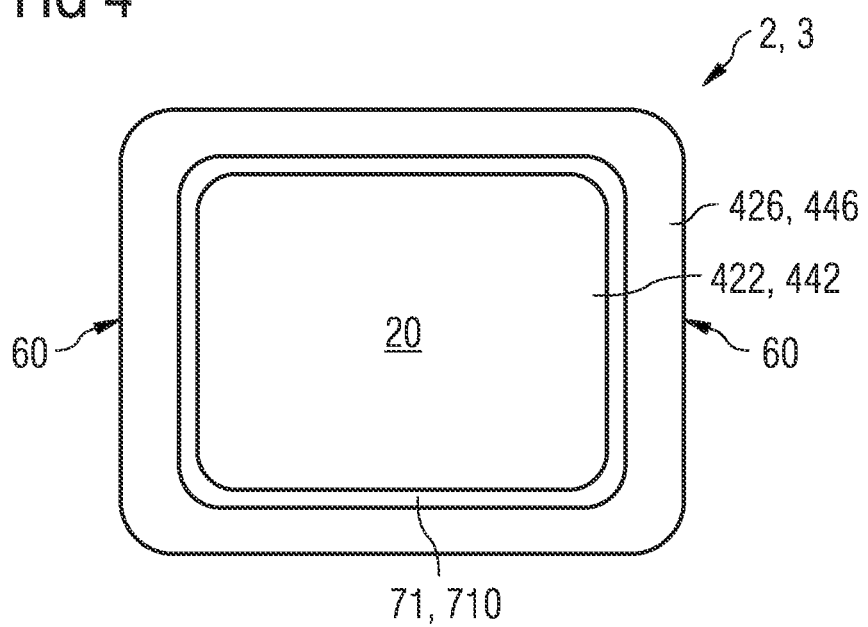
FIG. 4 shows, in schematic form, a top view of a semiconductor component with a lateral diffusion barrier.

FIG. 4 shows the semiconductor component 2, 3 of FIGS. 2 and 3 in top view. The semiconductor components 2, 3 differ in the depth of the trenches 71, 710, which is not visible in top view, and so the top view is no different. The lateral diffusion barrier 70, 700 circumvents the cell array 20 and the gate regions 30. The trenches 71, 710 preferably take the form of continuous circumferential rings, such that there is no connection between the edge field oxide 426 in the edge region and the cell field oxide 422 in the cell region at any point. The two regions are separated from one another by the trench 71, 710 and have no connection with one another. Equally, the buffer oxide 44 is divided into a buffer oxide edge region 446 and a buffer oxide cell region 442. Diffusion of mobile ions from the edge 60 of the component to the cell array 20 can thus be prevented. Rather than a complete circumferential ring, an open or interrupted ring with interruption at suitable points is also possible.

While the diffusion barrier 70, 700 is shown here along the lateral edge 60 of the semiconductor component 2, 3, the diffusion barrier 70, 700 can also be arranged differently. It is conceivable to arrange the diffusion barrier 70, 700 only around gate regions. It is also possible for a plurality of diffusion barriers 70, 700 to be arranged on one semiconductor component. It is also possible for a plurality of diffusion barriers 70, 700 to be arranged joined to one another, crossing one another or overlapping one another.

It is advantageous when the diffusion barrier 70, 700 forms a continuous ring, such that the region to be protected is entirely separate from the region into which mobile ions can penetrate.

Figure 5:
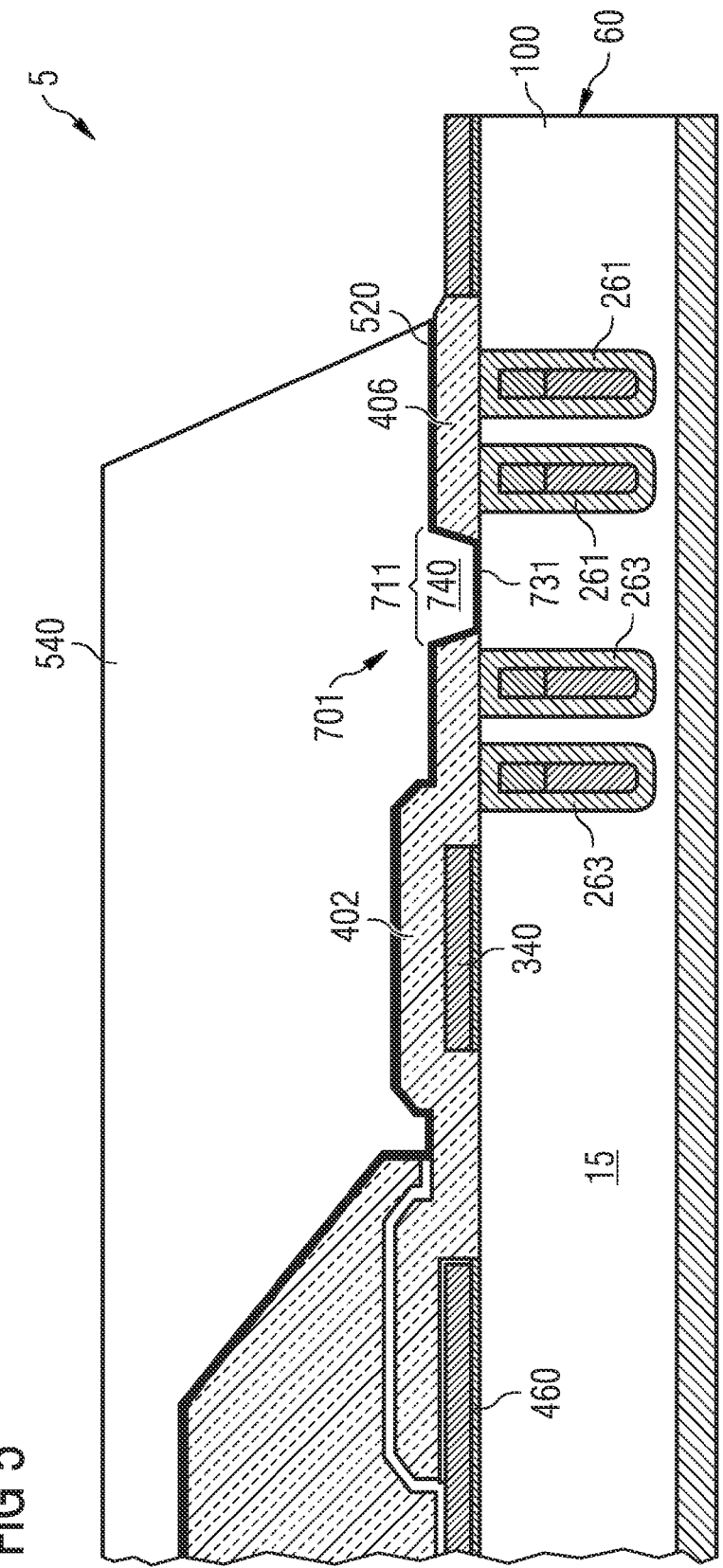
FIG. 5 shows a further example of a detail of an edge region of a semiconductor component with a lateral diffusion barrier.
Figure 6:
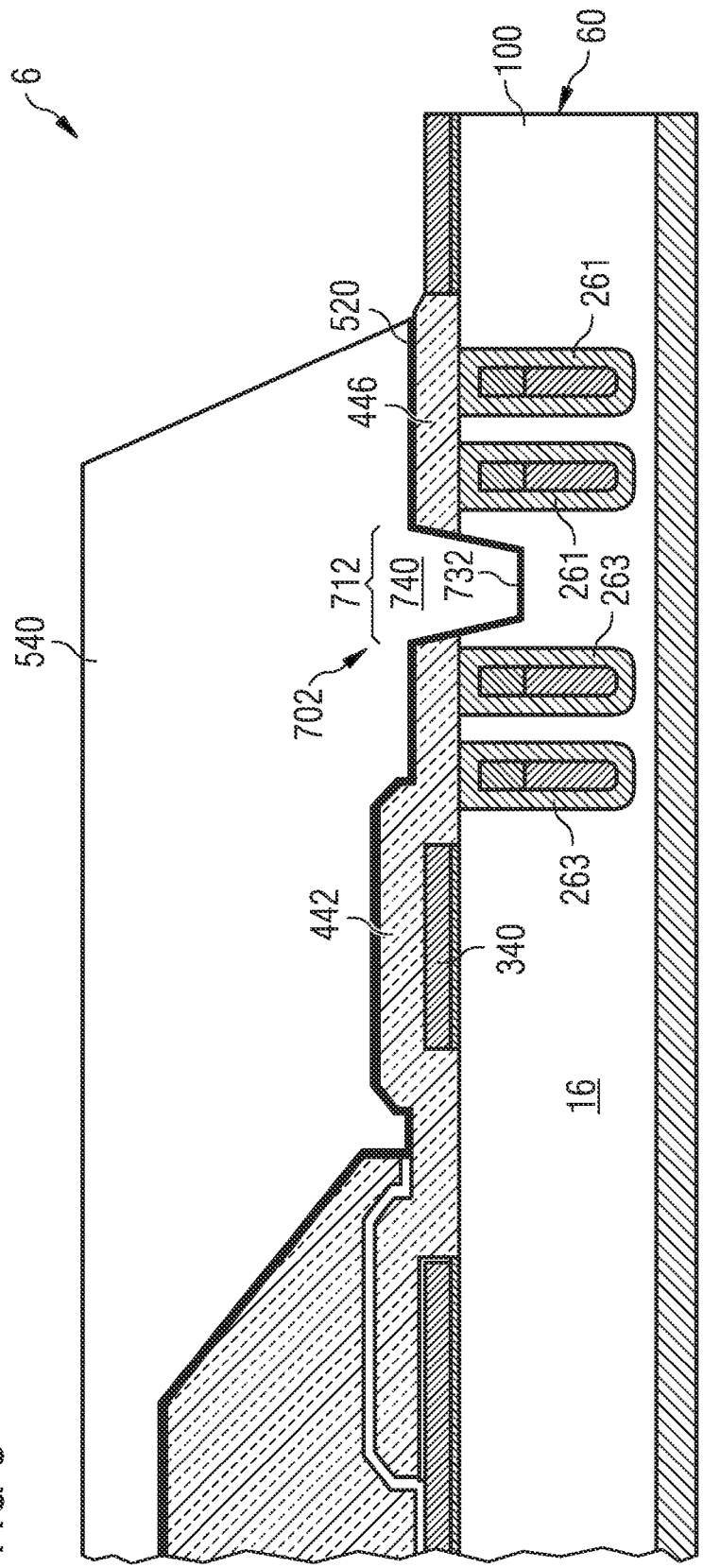
FIG. 6 shows an example of a semiconductor component with a lateral diffusion barrier.

FIGS. 5 and 6 show further examples of a semiconductor component 5, 6, which a person skilled in the art can combine directly with the examples of FIGS. 2 to 4. As shown in FIGS. 5 and 6, one or more edge trenches 261, 263 may also be provided in the edge region of the semiconductor component. These edge trenches 261, 263 may be designed, for example, as chipping stoppers. The diffusion barrier 701, 702 may be arranged between two or more trenches 261 and 263.

The examples of FIGS. 5 and 6 differ essentially by the depth of the trench 711, 712. In the example of FIG. 5, the trench base 731 composed of silicon nitride adjoins the semiconductor body 15. In the example of FIG. 6, trench 712 extends into the semiconductor body 16, and the trench base 732 composed of silicon nitride is below the surface of the semiconductor body 15, such that an overlap of the diffusion-stopping trench 712 with the semiconductor body 16 arises in this example, as described with reference to FIG. 3.

The diffusion barrier 70, 700, 701, 702 was described in the description given above as a trench 71, 710, 711, 712 filled with a silicon nitride layer 52, 57, 520 and imide 54, 540.

This embodiment can easily be integrated into existing operations. The imide filling 74, 740 can also be omitted, or the trench 71, 710, 711, 712 can be filled completely with silicon nitride 52, 57, 520. It is also possible to use a thinner barrier, for example in the form of a vertical silicon nitride wall which divides the cell region 20 from the edge region 60 and hence the insulation 40 into a cell insulation 402 and an edge insulation 406.

Figure 7:
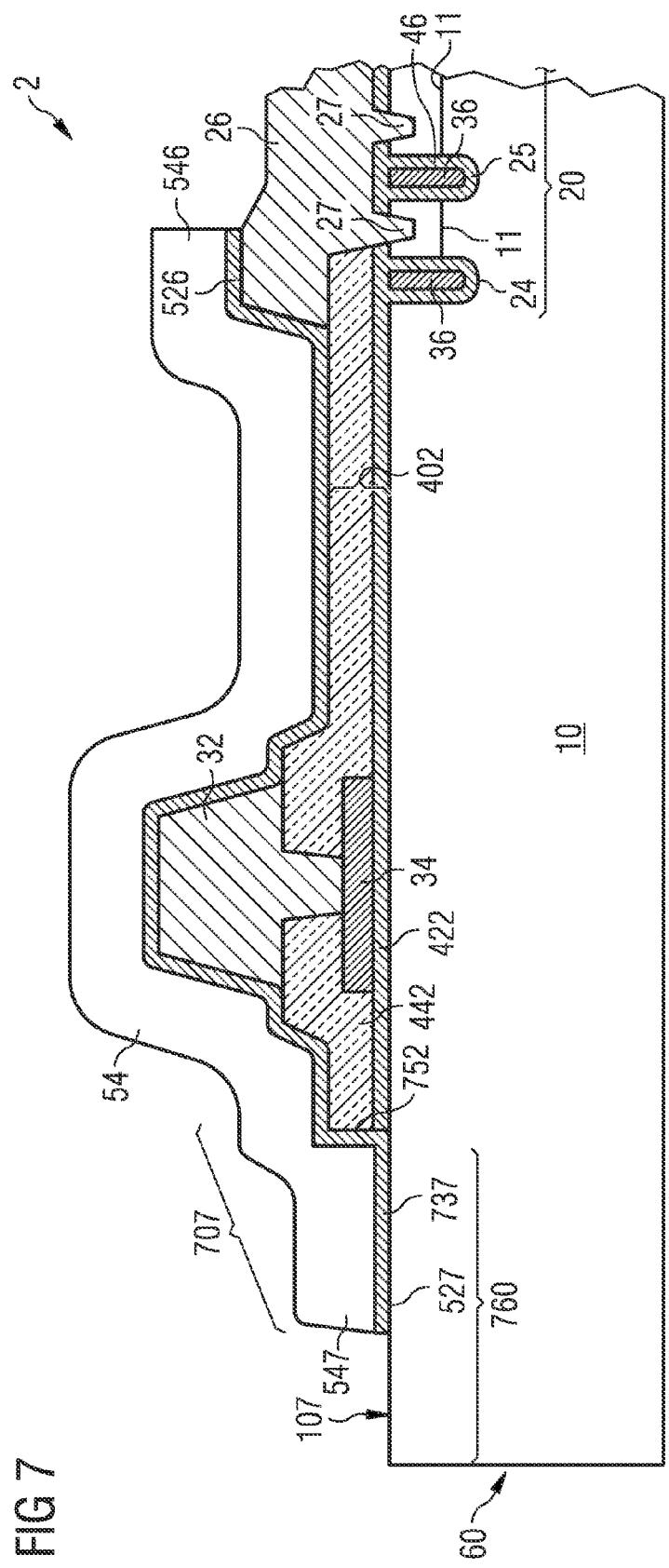
FIGS. 7 and 8 show further examples of a semiconductor component with a lateral diffusion barrier.

FIG. 7 shows a further example of a diffusion barrier. The cell region 20 in this example corresponds to FIG. 2, except that the diffusion barrier 707 here is not executed as a full trench. In this example, the diffusion barrier 707 is executed as a trench on one side and has only a lateral wall 752 on the cell array side. The base 737 of the diffusion barrier 707 in FIG. 7 is continued to the lateral edge 60 of the component and is in direct contact with the semiconductor body 10. The base 737 ends in the edge region 760 of the semiconductor body 10, where it is in direct contact with the semiconductor body 10. A second trench wall as in FIG. 2 is omitted in this example.

Aside from a second trench wall, there is also no field oxide edge region or buffer oxide edge region in the example of FIG. 7. The field oxide 422 and the buffer oxide 442 end, in the example of FIG. 7, at the trench wall 752 on the cell side.

The base 737 may comprise a barrier nitride layer 527 which may be bonded to the silicon nitride layer 52 of the vertical diffusion stop 50. The barrier nitride layer 527 is in direct contact on the upper side of the semiconductor body 10, but does not extend into the semiconductor body 10. The nitride of the barrier nitride layer 527 is in direct contact with the silicon in the semiconductor body 10 beneath, and hence two sealing materials here too cut off the diffusion of mobile ions. The direct contact of the barrier nitride layer 527 with the silicon in the semiconductor body 10 beneath may be in a direction from the cell array 20 to the lateral edge 60 of the semiconductor component over a length of a few μm up to 100 μm, for example in the range from 10 to 30 μm.

The barrier nitride layer 527 may be covered over its entire region by a barrier imide layer 547 which may be bonded to the imide 54 of the diffusion stop and be executed together therewith.

The base 737 with the barrier nitride layer 527 and the barrier imide layer 547 may be conducted up to the lateral edge 60 of the semiconductor component, but may also end in a region between the lateral edge 60 and lateral wall 752 on the cell array side, as shown in FIG. 7, such that a region with exposed semiconductor material 107 remains exposed or open. This exposed semiconductor region 107 may be undoped silicon, an at least partly undoped epitaxial layer, a homogeneously doped semiconductor material. This exposed semiconductor region 107 may be n-doped or p-doped. The exposed open semiconductor region 107 is advantageous in the individualization of the semiconductor components 10 from a wafer, since better sawing is possible here. Other division processes such as laser dicing or plasma dicing can also be performed more easily and with fewer faults on exposed semiconductor material.

Figure 8:
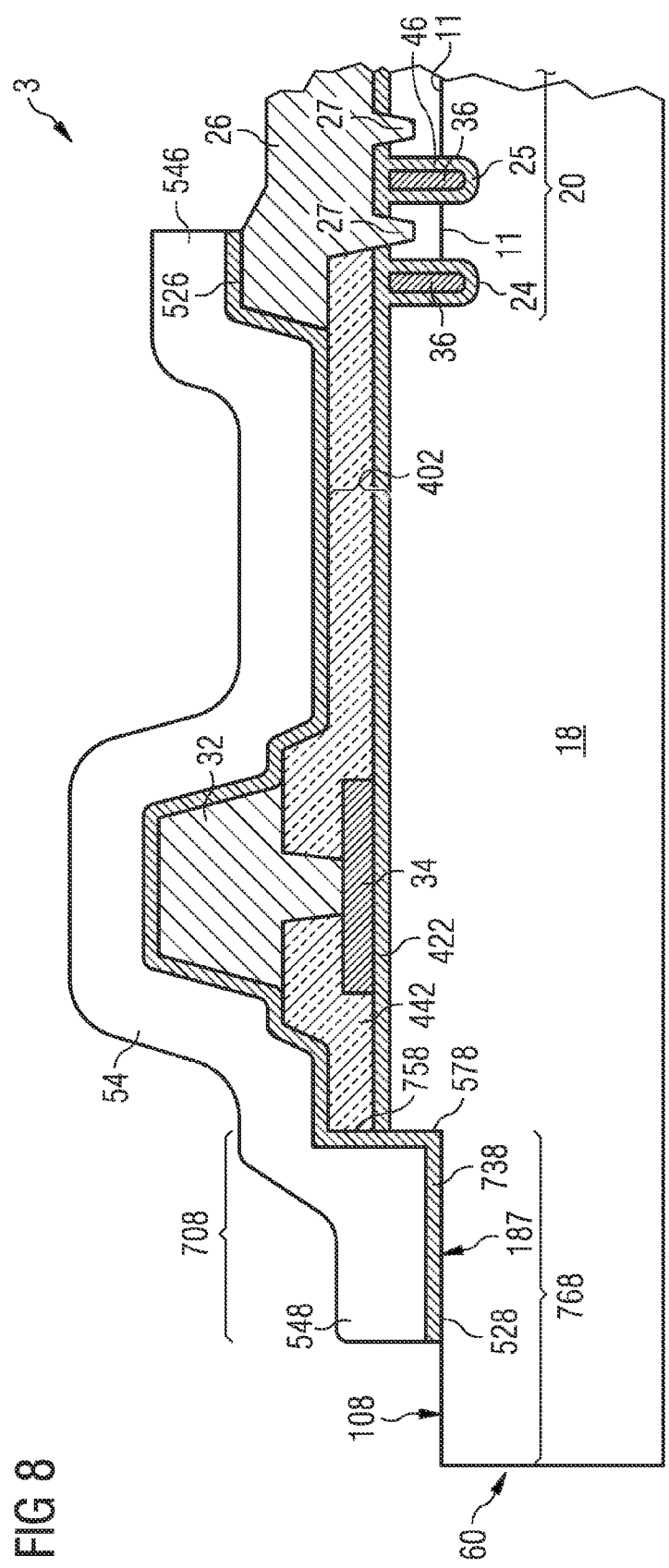

FIG. 8 shows a further example of a diffusion barrier 708. The cell region 20 in this example corresponds to FIG. 3, except that the diffusion barrier 708 is not executed as a complete trench here either. The diffusion barrier 708 is executed as a trench on one side and has only one lateral wall 758 on the cell array side, except that, in contrast to the example of FIG. 7, the lateral wall here also laterally delimits the semiconductor body 18. The base 738 of the diffusion barrier 708 in FIG. 8 is arranged in this example below the field oxide 422 and the buffer oxide 442 in vertical direction of the semiconductor 18. For this purpose, the semiconductor region has a recess 187 in the edge region 768, where the semiconductor body 18 has a lower thickness than in the cell array 20. The recess continues up to the lateral edge 60 of the semiconductor body 18 and is at least partly in direct contact with the base 738 of the diffusion barrier.

A second trench wall as in FIG. 3 is omitted in this example. In the example of FIG. 8, there is also no field oxide edge region or buffer oxide edge region. The field oxide 422 and the buffer oxide 442 end at the trench wall 758 on the cell side in the example of FIG. 8.

The base 738 may comprise a barrier nitride layer 528 which may be connected to the silicon nitride layer 52 of the vertical diffusion stop 50. The barrier nitride layer 528 is in direct contact on the upper side of the semiconductor body 18 and covers it partly in the vertical and horizontal direction. The nitride of the barrier nitride layer 528 is in direct contact with the silicon in the semiconductor body 18 beneath, and hence two sealing materials cut off the diffusion of mobile ions here too. The lateral delimitation and the recess in the semiconductor body 18 in the edge region 768 allow another improvement in the screening from the penetration of mobile ions.

The direct contact of the barrier nitride layer 528 with the silicon in the semiconductor body 18 beneath may be in a direction from the cell array 20 to the lateral edge 60 of the semiconductor component over a length of a few μm up to 100 μm, for example in the range from 10 to 30 μm.

The barrier nitride layer 528 may be covered over its entire region by a barrier imide layer 548 which may be bonded to the imide 54 of the diffusion stop and be executed together therewith.

The base 738 with the barrier nitride layer 528 and the barrier imide layer 548 may be conducted up to the lateral edge 60 of the semiconductor component 18, but may also end in a region between the lateral edge 60 and lateral wall 758 on the cell array side, as shown in FIG. 8, such that a region with exposed semiconductor material 108 remains exposed or open. This exposed semiconductor region 108 may be undoped silicon, an at least partly undoped epitaxial layer, a homogeneously doped semiconductor material. This exposed semiconductor region 108 may be n-doped or p-doped. The exposed open semiconductor region 108 is advantageous in the individualization of the semiconductor components 10 from a wafer, since better sawing is possible here. Other division processes such as laser dicing or plasma dicing can also be performed more easily and with fewer faults on exposed semiconductor material.

The invention claimed is:

1. A semiconductor component comprising:
    a semiconductor body;
    an insulation on the semiconductor body; and
    a cell array which is at least partly within the semiconductor body and comprises at least one p-n junction and at least one contact connection,
    wherein a cell region of the insulation on the semiconductor body is bounded in lateral direction of the semiconductor body by a circumferential diffusion barrier.

2. The semiconductor component of claim 1, wherein the circumferential diffusion barrier runs continuously around the circumference of the cell array.

3. The semiconductor component of claim 1, wherein the circumferential diffusion barrier is arranged between the cell array and a lateral edge of the semiconductor component.

4. The semiconductor component of claim 1, wherein the circumferential diffusion barrier comprises silicon nitride.

5. The semiconductor component of claim 1, wherein the circumferential diffusion barrier comprises an imide.

6. The semiconductor component of claim 1, wherein the circumferential diffusion barrier is in contact with the semiconductor body in a region between the cell array and a lateral edge of the semiconductor component.

7. The semiconductor component of claim 6, wherein the circumferential diffusion barrier ends before the lateral edge.

8. The semiconductor component of claim 1, wherein the circumferential diffusion barrier in an edge region covers the semiconductor body in a horizontal direction.

9. The semiconductor component of claim 1, wherein the circumferential diffusion barrier comprises a trench which cuts through the insulation and divides it into the cell region and an edge region.

10. The semiconductor component of claim 1, wherein the insulation comprises a silicon dioxide.

11. The semiconductor component of claim 1, wherein the circumferential diffusion barrier covers the cell region of the insulation in vertical direction of the semiconductor body.

12. The semiconductor component of claim 1, wherein the cell region of the insulation is fully surrounded by diffusion-stopping elements.

13. The semiconductor component of claim 6, wherein the circumferential diffusion barrier projects into a region below a surface of the semiconductor body in the cell array.

14. The semiconductor component of claim 13, wherein the semiconductor body in a lateral region has a recess which runs up to the lateral edge.

15. The semiconductor component of claim 9, wherein the trench projects into the semiconductor body.

16. The semiconductor component of claim 9, wherein the trench comprises at least one trench edge composed of silicon nitride.

17. The semiconductor component of claim 12, wherein a plurality of the diffusion-stopping elements are arranged overlapping one another.

18. The semiconductor component of claim 9, wherein the trench has been filled with an imide.

19. A field-effect-controlled semiconductor element comprising:
   a semiconductor body;
   an insulation on at least one side of the semiconductor body; and
      a cell array which is at least partly within the semiconductor body and comprises at least one p-n junction and at least one contact connection, and wherein the cell array comprises at least one gate electrode electrically insulated from the semiconductor body by at least one gate section of the insulation,
   wherein a diffusion barrier separates the insulation on the semiconductor body between the gate section of the insulation and a lateral edge of the field-effect-controlled semiconductor component in lateral direction of the semiconductor body.

* * * * *